(12) United States Patent
Kato et al.

(10) Patent No.: US 12,327,771 B2
(45) Date of Patent: Jun. 10, 2025

(54) SEMICONDUCTOR MODULE

(71) Applicant: FUJI ELECTRIC CO., LTD., Kawasaki (JP)

(72) Inventors: Ryoichi Kato, Matsumoto (JP); Yuma Murata, Matsumoto (JP); Naoyuki Kanai, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 596 days.

(21) Appl. No.: 17/825,300

(22) Filed: May 26, 2022

(65) Prior Publication Data

US 2022/0415729 A1 Dec. 29, 2022

(30) Foreign Application Priority Data

Jun. 25, 2021 (JP) .................... 2021-106025

(51) Int. Cl.
*H01L 23/049* (2006.01)
*H01L 23/00* (2006.01)
(Continued)

(52) U.S. Cl.
CPC ........ *H01L 23/049* (2013.01); *H01L 23/3121* (2013.01); *H01L 23/49* (2013.01);
(Continued)

(58) Field of Classification Search
CPC ... H01L 23/049; H01L 23/3121; H01L 23/49; H01L 24/48; H01L 25/072; H01L 23/3735; H01L 2224/48177; H01L 24/06; H01L 24/49; H01L 2224/04042; H01L 2224/49175; H01L 2924/181; H01L 23/04; H01L 23/24; H01L 23/3142; H01L 23/49811; H01L 23/5385; H01L 23/053; H01L 2224/0603; H01L 2224/48091;
(Continued)

(56) References Cited

U.S. PATENT DOCUMENTS

| 5,606,200 | A | 2/1997 | Haraguchi et al. |
| 2020/0066546 | A1* | 2/2020 | Kawashima ......... H01L 23/315 |

(Continued)

FOREIGN PATENT DOCUMENTS

| JP | 6-268102 A | 9/1994 |
| JP | 2003124406 A | 4/2003 |

(Continued)

*Primary Examiner* — Kyoung Lee
*Assistant Examiner* — Sophia W Kao

(57) ABSTRACT

There is provided a semiconductor module capable of preventing the peeling of a sealing resin on the side where connection sections used for the connection to semiconductor elements are arranged. A semiconductor module includes: an outer frame; sealing resins; gate signal output terminals, and partition sections laid across the outer flame to partition a space into a plurality of housing sections, in the partition sections which the gate signal output terminals with connection sections exposed are arranged. The partition sections have first surface sections on the side where the connection sections are arranged and second surface sections formed, on the side where the connection sections are not arranged, such that the peeling strength to the sealing resins is lower than that of the first surface sections.

10 Claims, 8 Drawing Sheets

(51) Int. Cl.
*H01L 23/31* (2006.01)
*H01L 23/373* (2006.01)
*H01L 23/49* (2006.01)
*H01L 25/07* (2006.01)

(52) U.S. Cl.
CPC ............ H01L 24/48 (2013.01); H01L 25/072 (2013.01); *H01L 23/3735* (2013.01); *H01L 2224/48177* (2013.01)

(58) Field of Classification Search
CPC . H01L 2224/48227; H01L 2224/49109; H01L 2924/00014; H01L 23/49548
See application file for complete search history.

(56) References Cited

U.S. PATENT DOCUMENTS

2020/0395278 A1\* 12/2020 Harada ................... H01L 25/07
2022/0399241 A1\* 12/2022 Itoh ....................... H01L 23/562

FOREIGN PATENT DOCUMENTS

| JP | 201264880 A | | 3/2012 |
| JP | 2012204366 A | \* | 10/2012 |
| JP | 2014229848 A | | 12/2014 |

\* cited by examiner

SEMICONDUCTOR MODULE

CROSS-REFERENCE TO RELATED APPLICATIONS

This application claims benefit of priority under 35 USC 119 based on Japanese Patent Application No. 2021-106025, filed on Jun. 25, 2021 in the Japan Patent Office, the entire contents of which are incorporated by reference herein.

TECHNICAL FIELD

The present invention relates to a semiconductor module applied to a power converter and the like.

BACKGROUND ART

In recent years, power semiconductor modules, mainly an insulated gate bipolar transistor (IGBT), have been widely used for power converters. The power semiconductor module is a power semiconductor device containing one or two or more power semiconductor chips and forming part or all of conversion connections, and having a structure in which the one or two or more power semiconductor chips are electrically insulated from a base plate or a cooling surface.

PTL 1 discloses a semiconductor device capable of reducing the occurrence of the peeling of bonding wires. PTL 2 discloses a resin-sealed semiconductor device which is robust and has high reliability by preventing the occurrence of bonding defects between device structural members. PTL 3 discloses a semiconductor device capable of suppressing the peeling of a sealing resin even when operated at a high temperature. PTL 4 discloses a metal press working method enabling partial roughening treatment in a short time and a resin-sealed metal component having excellent sealing properties and peeling strength by ensuring bonding properties and adhesiveness to a resin of a metal component for resin sealing obtained by the metal press working method.

CITATION LIST

Patent Literature

PTL 1: JP 2014-229848 A
PTL 2: JP 6-268102 A
PTL 3: JP 2012-204366 A
PTL 4: JP 2012-64880 A

Non Patent Literature

NPL 1: "Proposal of the application of the delamination test to semiconductor package stress design", Ryuichi KUSAMA et al., MES2013 (23rd Microelectronics Symposium), September 2013, p.p. 317-320

SUMMARY OF INVENTION

Technical Problem

The power semiconductor modules have been required to have various sizes from a small size to a large size with an increase in current and withstand voltage. Under such circumstances, there is a risk that a stress generated on the surface of a structure adhering to a sealing resin provided in the power semiconductor module increases, so that the sealing resin is peeled from the structure. The peeling of the sealing resin from the structure has posed a problem of the occurrence of a break in a wire provided in the sealing resin and used for wire bonding.

It is an object of the present invention to provide a semiconductor module capable of preventing the peeling of a sealing resin on the side where connection sections used for the connection to semiconductor elements are arranged.

Solution to Problem

To achieve the above-described object, a semiconductor module according to one aspect of the present invention has: an outer frame defining a space where a plurality of semiconductor elements is arranged; sealing resins formed in the space to cover the plurality of semiconductor elements; control terminals connected to the semiconductor elements and configured to output control signals to the semiconductor elements, the control signals controlling the semiconductor elements; and a partition section laid across the outer frame to partition the space into a plurality of regions, in the partition section which the control terminals with connection sections to the semiconductor elements exposed are arranged, in which the partition section has a first surface section on the side where the connection sections are arranged and a second surface section formed, on the side where the connection sections are not arranged, such that the peeling strength to the sealing resin is lower than the peeling strength to the sealing resin of the first surface section.

Advantageous Effects of Invention

One aspect of the present invention can prevent the peeling of the sealing resin on the side where the connection sections used for the connection to the semiconductor elements are arranged.

DESCRIPTION OF EMBODIMENTS

Each embodiment of the present invention exemplifies a device and a method for embodying the technical idea of the present invention, and the technical idea of the present invention does not specify the materials, shapes, structures, arrangement, and the like of constituent components to the materials, shapes, structures, arrangement, and the like described below. The technical idea of the present invention can be variously altered within the technical scope defined by claims.

Figure 1:
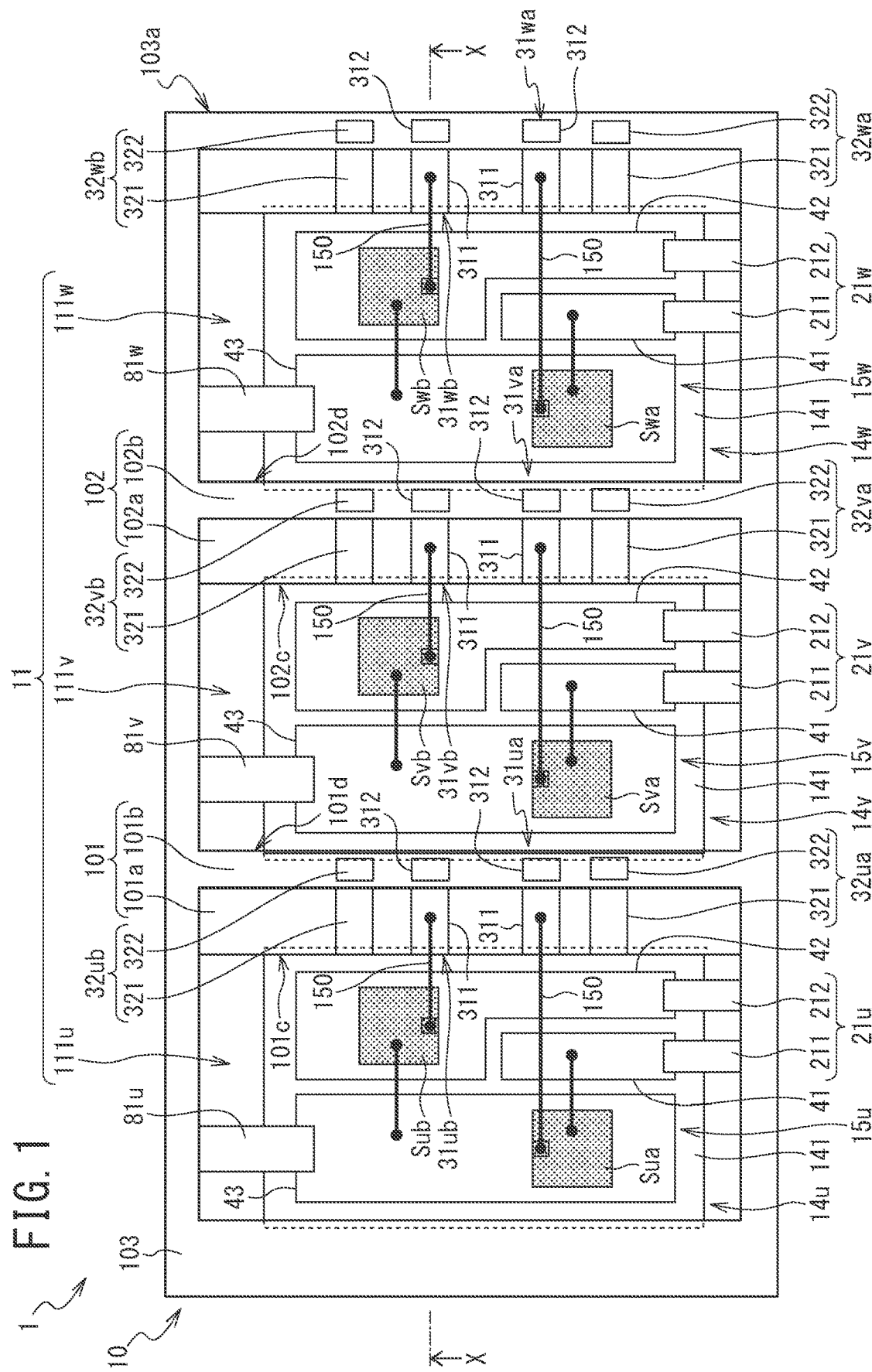
FIG. 1 is a plan view illustrating an example of the schematic configuration of a semiconductor module according to one embodiment of the present invention.

A semiconductor module according to one embodiment of the present invention is described using FIG. 1 to FIG. 8. First, the schematic configuration of the semiconductor module according to this embodiment is described using FIG. 1 to FIG. 5. In this embodiment, a description is given taking a power conversion module enabling DC/AC conversion as an example of the semiconductor module. In FIG. 1, the illustration of sealing resins provided in the semiconductor module is omitted.

As illustrated in FIG. 1, a semiconductor module 1 according to this embodiment includes an outer frame 103 defining a space 11 where a plurality of semiconductor elements Sua, Sub, Sva, Svb, Swa, Swb is arranged. The outer frame 103 defines the space 11 in a rectangular shape in plan view. The outer frame 103 is made of a thermoplastic resin having insulation properties, for example. Examples of the thermoplastic resin include a polyphenylene sulfide (PPS) resin, a polybutylene terephthalate (PBT) resin, a polybutylene succinate (PBS) resin, a polyamide (PA) resin, an acrylonitrile butadiene styrene (ABS) resin, and the like, for example.

The semiconductor module 1 includes sealing resins 61$u$, 61$v$, 61$w$ formed in the space 11 to cover the plurality of semiconductor elements Sua to Swb. The sealing resins 61$u$, 61$v$, 61$w$ are made of a material different from the material of the outer frame 103, for example. The sealing resins 61$u$, 61$v$, 61$w$ are made of an epoxy resin, for example. The sealing resins 61$u$, 61$v$, 61$w$ are sealing members sealing constituent elements, such as the plurality of semiconductor elements Sua to Swb provided in the space 11 and laminated substrates 14$u$, 14$v$, 14$w$ mounted with the plurality of semiconductor elements Sua to Swb. The sealing resins 61$u$, 61$v$, 61$w$ can improve the insulation properties between a predetermined conductive pattern (details of which are described later) formed on each of the laminated substrates 14$u$, 14$v$, 14$w$ by sealing the laminated substrates 14$u$, 14$v$, 14$w$, respectively. Further, the sealing resins 61$u$, 61$v$, 61$w$ seal various control terminals (details of which are described later) connected to the laminated substrates 14$u$, 14$v$, 14$w$ by wire bonding and wires, for example, used for the wire bonding, and thus can suppress stresses and strains generated in the various control terminals and bonded sections of the wires. Thus, the sealing resins 61$u$, 61$v$, 61$w$ can improve the reliability of the semiconductor module 1.

The semiconductor module 1 includes gate signal output terminals 31$ua$, 31$ub$, 31$va$, 31$vb$, 31$wa$, 31$wb$ (an example of the control terminal) which are connected to the semiconductor elements Sua to Swb and from which gate pulse signals (an example of the control signal) controlling the semiconductor elements Sua to Swb are output and reference signal output terminals 32$ua$, 32$ub$, 32$va$, 32$vb$, 32$wa$, 32$wb$ (an example of the control terminal) which are connected to the semiconductor elements Sua to Swb and from which reference signals are output. Details of the terminals, such as the gate signal output terminal 31$ua$, are described later.

The semiconductor module 1 includes partition sections 101, 102 laid across the outer frame 103 to partition the space 11 into a plurality of housing sections 111$u$, 111$v$, 111$w$ (an example of the plurality of regions), in the partition sections 101, 102 which the gate signal output terminals 31$ua$ to 31$wb$ with connection sections 311 to the semiconductor elements Sua to Swb exposed and the reference signal output terminals 32$ua$ to 32$wb$ with connection sections 312 to the semiconductor elements Sua to Swb exposed are arranged. The partitions 101, 102 are formed of the same material as the material of the outer frame 103 integrally with the outer frame 103. A case 10 is constituted by the partition sections 101, 102 and the outer frame 103. Details of the partition sections 101, 102 are described later.

As illustrated in FIG. 1, in the case 10, the space 11 is divided by the partition sections 101, 102 into the three regions of the housing section 111$u$ housing a U-phase inverter section, the housing section 111$v$ housing a V-phase inverter section, and the housing section 111$w$ housing a W-phase inverter section. The partition section 101 partitions a part of the space 11 into the housing section 111$u$ and the housing section 111$v$. The partition section 102 partitions the other part of the space 11 into the housing section 111$v$ and the housing section 111$w$.

The housing section 111$u$ has a rectangular shape in plan view. The housing section 111$u$ is defined by parts of the outer frame 103 arranged on the three consecutive sides (two short sides and one long side) of the four outer peripheral sides and the partition section 101 arranged on the remaining one side (the remaining long side). The housing section 111$v$ has a rectangular shape in plan view. The housing section 111$v$ is defined by the other parts of the outer frame 103 arranged on the facing short sides of the four outer peripheral sides and the partition section 101 and the partition section 102 arranged on the facing long sides. The housing section 111$w$ has a rectangular shape in plan view. The housing section 111$w$ is defined by the remaining parts of the outer frame 103 arranged on the three consecutive sides (two short sides and one long side) of the four outer peripheral sides and the partition section 102 arranged on the remaining one side (the remaining long side).

As illustrated in FIG. 1, the semiconductor module 1 has the laminated substrate 14$u$ for the U-phase housed in the housing section 111$u$ and an inverter circuit 15$u$ for the U-phase mounted on the laminated substrate 14$u$. The semiconductor module 1 has the laminated substrate 14$v$ for the V-phase housed in the housing section 111$v$ and an inverter circuit 15$v$ for the V-phase mounted on the laminated substrate 14$v$. The semiconductor module 1 has the laminated substrate 14$w$ for the W-phase housed in the housing section 111$w$ and an inverter circuit 15$w$ for the W-phase mounted on the laminated substrate 14$w$.

As illustrated in FIG. 1, the semiconductor module 1 has a U-phase power input terminal 21$u$ into which DC power is input from the outside, a V-phase power input terminal 21$v$ into which the DC power is input, and a W-phase power input terminal 21$w$ into which the DC power is input. Each of the power input terminals 21$u$, 21$v$, 21$w$ has a positive electrode terminal 211 connected to the positive electrode side of the DC power and a negative electrode terminal 212 connected to the negative electrode side of the DC power.

The semiconductor module 1 has a power output terminal 81u arranged in a part of the outer frame 103 to face the power input terminal 21u across the housing section 111u. The semiconductor module 1 has a power output terminal 81v arranged in a part of the outer frame 103 to face the power input terminal 21v across the housing section 111v. The semiconductor module 1 has a power output terminal 81w arranged in a part of the outer frame 103 to face the power input terminal 21w across the housing section 111w.

The positive electrode terminal 211 of the power input terminal 21u is connected to a positive electrode section pattern 41 which is formed on the laminated substrate 14u and to which the semiconductor element Sua is connected. The negative electrode terminal 212 of the power input terminal 21u is connected to a negative electrode section pattern 42 which is formed on the laminated substrate 14u and to which the semiconductor element Sub is connected. The power output terminal 81u is connected to an output section pattern 43 formed on the laminated substrate 14u. Thus, the semiconductor module 1 can generate U-phase AC power by the inverter circuit 15u using the DC power supplied from the outside via the power input terminal 21u, and supply the generated U-phase AC power from the power output terminal 81u to a motor M (not illustrated in FIG. 1, see FIG. 3), for example, to be driven.

The positive electrode terminal 211 of the power input terminal 21v is connected to the positive electrode section pattern 41 which is formed on the laminated substrate 14v and to which the semiconductor element Sva is connected. The negative electrode terminal 212 of the power input terminal 21v is connected to the negative electrode section pattern 42 which is formed on the laminated substrate 14v and to which the semiconductor element Svb is connected. The power output terminal 81v is connected to the output section pattern 43 formed on the laminated substrate 14v. Thus, the semiconductor module 1 can generate V-phase AC power by the inverter circuit 15v using the DC power supplied from the outside via the power input terminal 21v, and supply the generated V-phase AC power from the power output terminal 81v to the motor M, for example, to be driven.

The positive electrode terminal 211 of the power input terminal 21w is connected to the positive electrode section pattern 41 which is formed on the laminated substrate 14w; and to which the semiconductor element Swa is connected. The negative electrode terminal 212 of the power input terminal 21w is connected to the negative electrode section pattern 42 which is formed on the laminated substrate 14w and to which the semiconductor element Swb is connected. The power output terminal 81w is connected to the output section pattern 43 formed on the laminated substrate 14w. Thus, the semiconductor module 1 can generate W-phase AC power by the inverter circuit 15w using the DC power supplied from the outside via the power input terminal 21w, and supply the generated W-phase AC power from the power output terminal 81w to the motor M, for example, to be driven.

As illustrated in FIG. 1, in the partition section 101, the reference signal output terminal 32ua, the gate signal output terminal 31ua, the gate signal output terminal 31ub, and the reference signal output terminal 32ub connected to the inverter circuit 15u are arranged side by side in this order from the power input terminal 21u side toward the power output terminal 81u side. The order and the number of the gate signal output terminals 31ua, 31ub and the reference signal output terminal 32ua, 32ub arranged side by side in the extension direction of the partition section 101 are not limited to the order and the number illustrated in FIG. 1 and may vary depending on the configuration and the arrangement pattern of the inverter circuit 15u to be provided on the laminated substrate 14u.

In the partition section 102, the reference signal output terminal 32va, the gate signal output terminal 31va, the gate signal output terminal 31vb, and the reference signal output terminal 32vb connected to the inverter circuit 15v are arranged side by side in this order from the power input terminal 21v side to the power output terminal 81v side. The order and the number of the gate signal output terminals 31va, 31vb and the reference signal output terminals 32va, 32vb arranged side by side in the extension direction of the partition section 102 are not limited to the order and the number illustrated in FIG. 1 and may vary depending on the configuration and the arrangement pattern of the inverter circuit 15v to be provided on the laminated substrate 14v.

In a terminal arrangement region 103a parallel to the partition sections 101, 102 and forming a part of the outer frame 103 defining the housing section 111w, the reference signal output terminal 32wa, the gate signal output terminal 31wa, the gate signal output terminal 31wb, and the reference signal output terminal 32wb connected to the inverter circuit 15w are arranged side by side in this order from the power input terminal 21w side toward the power output terminal 81w side. The order and the number of the gate signal output terminals 31wa, 31wb and the reference signal output terminals 32wa, 32wb arranged side by side in the extension direction of the terminal arrangement region 103a are not limited to the order and the number illustrated in FIG. 1 and may vary depending on the configuration and the arrangement pattern of the inverter circuit 15w to be provided on the laminated substrate 14w.

The gate signal output terminal 31ua and the reference signal output terminal 32ua arranged in the partition section 101 each are electrically connected to the semiconductor element Sua constituting the inverter circuit 15u by wire bonding. Specifically, the connection section 311 of the gate signal output terminal 31ua and the connection section 321 of the reference signal output terminal 32ua are connected to the semiconductor element Sua by separate wires 150. An input section 312 of the gate signal output terminal 31ua and an input section 322 of the reference signal output terminal 32ua each are connected to a control circuit (not illustrated) controlling the inverter circuits 15u, 15v, 15w.

The gate signal output terminal 31ub and the reference signal output terminal 32ub arranged in the partition section 101 each are electrically connected to the semiconductor element Sub constituting the inverter circuit 15u by wire bonding. Specifically, the connection section 311 of the gate signal output terminal 31ub and the connection section 321 of the reference signal output terminal 32ub are connected to the semiconductor element Sub by different wires 150. The input section 312 of the gate signal output terminal 31ub and the input section 322 of the reference signal output terminal 32ub each are connected to a control circuit (not illustrated) controlling the inverter circuits 15u, 15v, 15w.

The gate signal output terminal 31va and the reference signal output terminal 32va arranged in the partition section 102 each are electrically connected to the semiconductor element Sva constituting the inverter circuit 15v by wire bonding. Specifically, the connection section 311 of the gate signal output terminal 31va and the connection section 321 of the reference signal output terminal 32va are connected to the semiconductor element Sva by separate wires 150. The input section 312 of the gate signal output terminal 31va and the input section 322 of the reference signal output terminal 32wa each are connected to the control circuit (not illustrated) controlling the inverter circuits 15u, 15v, 15w.

The gate signal output terminal 31vb and the reference signal output terminal 32vb arranged in the partition section 102 each are electrically connected to the semiconductor element Svb constituting the inverter circuit 15v by wire bonding. Specifically, the connection section 311 of the gate signal output terminal 31vb and the connection section 321 of the reference signal output terminal 32vb are connected to the semiconductor element Svb by different wires 150. The input section 312 of the gate signal output terminal 31vb and the input section 322 of the reference signal output terminal 32vb each are connected to the control circuit (not illustrated) controlling the inverter circuits 15u, 15v, 15w.

The gate signal output terminal 31wa and the reference signal output terminal 32wa arranged in the terminal arrangement region 103a of the outer frame 103 each are electrically connected to the semiconductor element Swa constituting the inverter circuit 15w by wire bonding. Specifically, the connection section 311 of the gate signal output terminal 31wa and the connection section 321 of the reference signal output terminal 32wa are connected to the semiconductor element Swa by separate wires 150. The input section 312 of the gate signal output terminal 31wa and the input section 322 of the reference signal output terminal 32wa each are connected to the control circuit (not illustrated) controlling the inverter circuits 15u, 15v, 15w.

The gate signal output terminal 31wb and the reference signal output terminal 32wb arranged in the terminal arrangement region 103a of the outer frame 103 each are electrically connected to the semiconductor element Swb constituting the inverter circuit 15w by wire bonding. Specifically, the connection section 311 of the gate signal output terminal 31wb and the connection section 321 of the reference signal output terminal 32wb are connected to the semiconductor element Swb by different wires 150. The input section 312 of the gate signal output terminal 31wb and the input section 322 of the reference signal output terminal 32wb each are connected to the control circuit (not illustrated) controlling the inverter circuits 15u, 15v, 15w.

Figure 2:
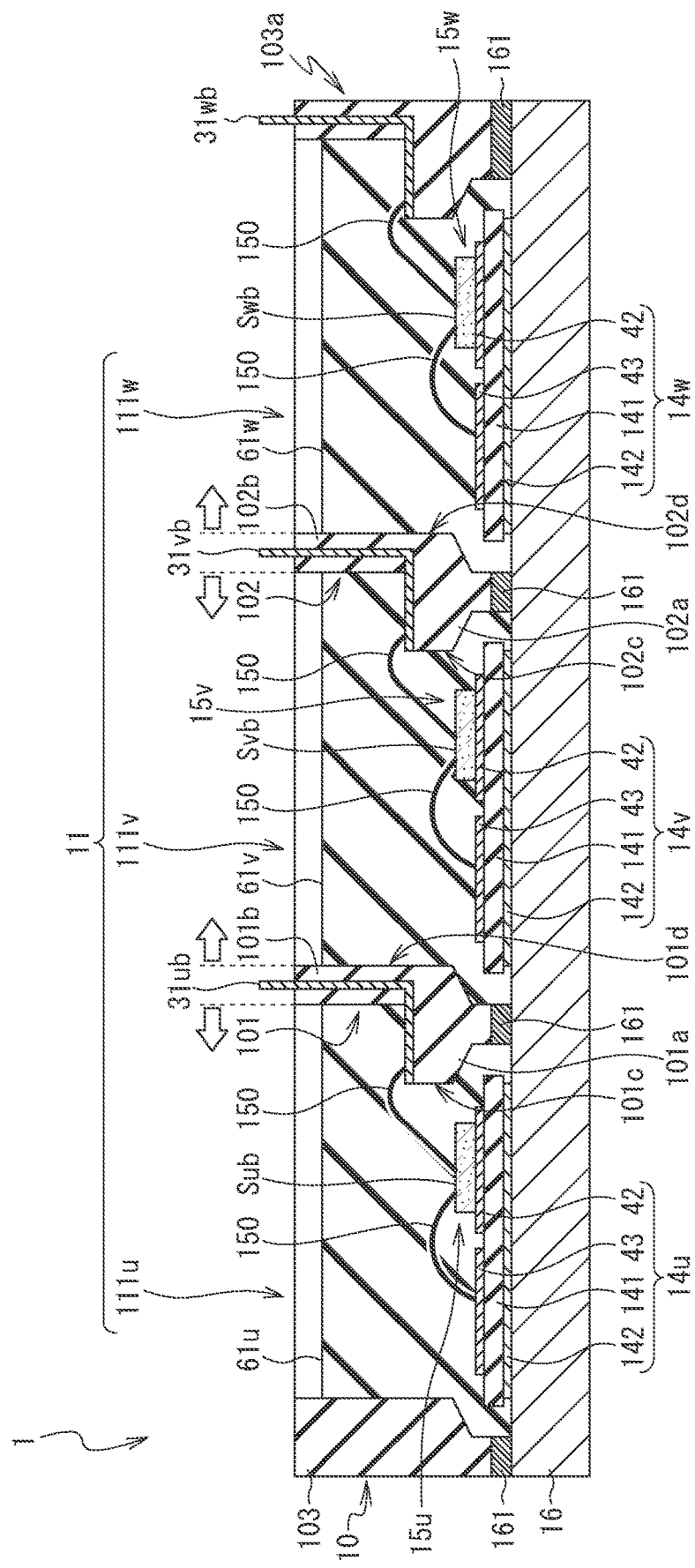
FIG. 2 is a diagram for explaining an example of the schematic configuration of the semiconductor module according to one embodiment of the present invention and is a cross-sectional view cut along the X-X line illustrated in FIG. 1.

As illustrated in FIG. 2, the semiconductor module 1 has a cooler 16 attached to the case 10. The cooler 16 is mechanically fixed to the case 10 with an adhesive 161, for example. The laminated substrates 14u, 14v, 14w are soldered, for example, to the cooler 16. Thus, the semiconductor module 1 can release heat generated from the semiconductor elements Sua to Swb provided on each of the laminated substrates 14u, 14v, 14w to the outside via the cooler 16.

The laminated substrate 14u arranged in the housing section 111u has a rectangular flat plate-shaped insulating substrate 141 and a rectangular flat plate-shaped heat transfer member 142 formed on the lower surface (cooler 16 side) of the insulating substrate 141. The insulating substrate 141 is made of ceramic, for example. The heat transfer member 142 is made of copper, for example. The heat transfer member 142 is connected to the cooler 16 by soldering, for example. On the upper surface of the insulating substrate 141 (the surface opposite to the surface on which the heat transfer member 142 is provided), the inverter circuit 15u is provided.

The laminated substrate 14u arranged in the housing section 111u and the inverter circuit 15u provided on the upper surface of the insulating substrate 141 of the laminated substrate 14u are covered with the sealing resin 61u formed in the housing section 111u. Further, the wire 150 connecting the gate signal output terminal 31ub and the semiconductor element Sub, the wire 150 connecting the semiconductor element Sub and the output section pattern 43, and the other wires 150 used for the wire bonding in the inverter circuit 15u (not illustrated in FIG. 2) are also covered with the sealing resin 61u. The sealing resin 61u seals the inverter circuit 15u and the like in a state of being filled in the space constituting the housing section 111u. Thus, the sealing resin 61u is also formed in gaps among the positive electrode section pattern 41, the negative electrode section pattern 42, and the output section pattern 43 formed on the insulating substrate 141. As a result, the sealing resin 61u can improve the insulation properties of the laminated substrate 14u. The sealing resin 61u is formed in the housing section 111u in a state of covering metal parts, such as the connection section 311 of each of the gate signal output terminals 31ua, 31ub, the connection section 321 of each of the reference signal output terminals 32ua, 32ub, the connection sections used for the electrical connection in the inverter circuit 15u, and the wires 150. As a result, the sealing resin 61u can suppress stresses and strains generated in the connection sections and the bonded sections of the wires 150 by sealing the connection sections, the wires 150, and the like, and therefore can improve the reliability of the semiconductor module 1.

As illustrated in FIG. 2, the laminated substrate 14v arranged in the housing section 111v and the sealing resin 61v formed in the housing section 111v have the same states as the states of the laminated substrate 14u and the sealing resin 61u in the housing section 111u. Therefore, the sealing resin 61v is also formed in gaps among the positive electrode section pattern 41, the negative electrode section pattern 42, and the output section pattern 43 formed on the insulating substrate 141 of the laminated substrate 14v. As a result, the sealing resin 61v can improve the insulation properties in the laminated substrate 14v. The sealing resin 61v is formed in the housing section 111v in a state of covering metal parts, such as the connection section 311 of each of the gate signal output terminals 31va, 31vb, the connection section 321 of each of the reference signal output terminals 32va, 32vb, the connection sections used for the electrical connection in the inverter circuit 15v, and the wires 150. As a result, the sealing resin 61v can suppress stresses and strains generated in the connection sections and the bonded sections of the wires 150 by sealing the connection sections, the wires 150, and the like, and therefore can improve the reliability of the semiconductor module 1.

As illustrated in FIG. 2, the laminated substrate 14w arranged in the housing section 111w and the sealing resin 61w formed in the housing section 111w have the same states as the states of the laminated substrate 14u and the sealing resin 61u in the housing section 111u. Therefore, the sealing resin 61w is also formed in gaps among the positive electrode section pattern 41, the negative electrode section pattern 42, and the output section pattern 43 formed on the insulating substrate 141 of the laminated substrate 14w. As a result, the sealing resin 61w can improve the insulation properties in the laminated substrate 14w. The sealing resin 61w is formed in the housing section 111w in a state of covering metal parts, such as the connection section 311 of each of the gate signal output terminals 31wa, 31wb, the connection section 321 of each of the reference signal output terminals 32wa, 32wb, the connection sections used for the electrical connection in the inverter circuit 15w, and the wires 150. As a result, the sealing resin 61w can suppress stresses and strains generated in the connection sections and the bonded sections of the wires 150 by sealing the connection sections, the wires 150, and the like, and therefore can improve the reliability of the semiconductor module 1.

Figure 3:
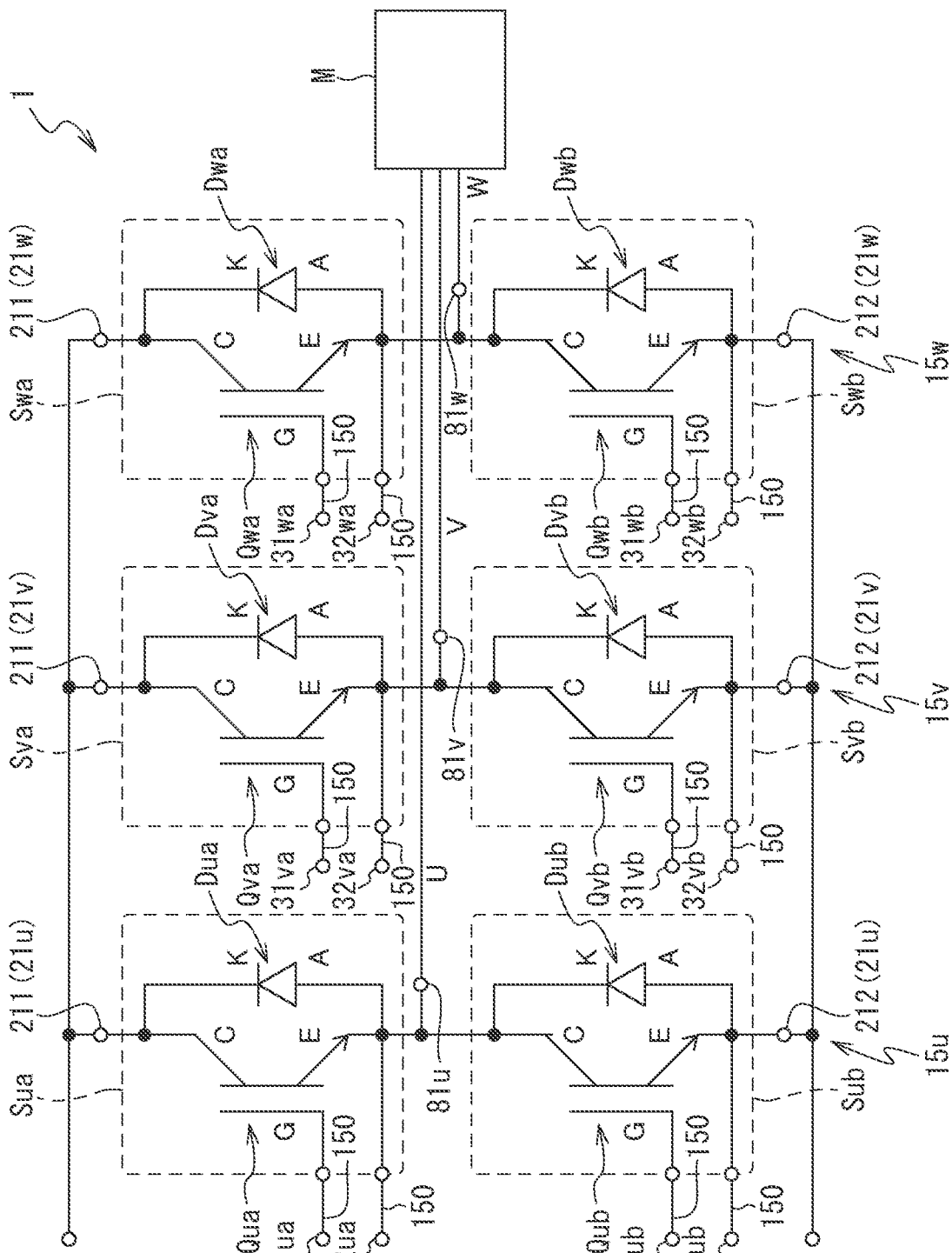
FIG. 3 is a circuit diagram illustrating an example of inverter circuits provided in the semiconductor module according to one embodiment of the present invention.

Next, the circuit configurations of the inverter circuits 15u, 15v, 15w provided in the semiconductor module 1 are described using FIG. 3.

As illustrated in FIG. 3, the inverter circuit 15u provided in the semiconductor module 1 includes the semiconductor element Sua and the semiconductor element Sub connected in series between the positive electrode terminal 211 and the negative electrode terminal 212 of the power input terminal 21u. A connection section between the semiconductor element Sua and the semiconductor element Sub is connected to the power output terminal 81u from which the U-phase AC power is output. In the inverter circuit 15u, the semiconductor element Sua constitutes an upper arm of the U-phase AC power, and the semiconductor element Sub constitutes a lower arm of the U-phase AC power.

The inverter circuit 15v provided in the semiconductor module 1 includes the semiconductor element Sva and the semiconductor element Svb connected in series between the positive electrode terminal 211 and the negative electrode terminal 212 of the power input terminal 21v. A connection section between the semiconductor element Sva and the semiconductor element Svb is connected to the power output terminal 81v from which the V-phase AC power is output. The semiconductor element Sva constitutes an upper arm of the V-phase AC power, and the semiconductor element Svb constitutes a lower arm of the V-phase AC power.

The inverter circuit 15w provided in the semiconductor module 1 includes the semiconductor element Swa and the semiconductor element Swb connected in series between the positive electrode terminal 211 and the negative electrode terminal 212 of the power input terminal 21w. A connection section between the semiconductor element Swa and semiconductor element Swb is connected to the power output terminal 81w from which the W-phase AC power is output. The semiconductor element Swa constitutes an upper arm of the W-phase AC power, and the semiconductor element Swb constitutes a lower arm of the W-phase AC power.

As illustrated in FIG. 3, the semiconductor element Sua has a transistor Qua, which is an insulated gate bipolar transistor (IGBT), for example, and a free wheeling diode Dua connected in antiparallel to the transistor Qua. The transistor Qua and the free wheeling diode Dua are formed on one semiconductor substrate and made into one chip, for example. The semiconductor element Sub has a transistor Qub, which is the IGBT, for example, and a free wheeling diode Dub connected in antiparallel to the transistor Qub. The transistor Qub and the free wheeling diode Dub are formed on one semiconductor substrate and made into one chip, for example.

A collector C of the transistor Qua and a cathode K of the free wheeling diode Dua are connected to each other and connected to the positive electrode terminal 211 of the power input terminal 21u. An emitter E of the transistor Qua and an anode A of the free wheeling diode Dua are connected to each other. A collector C of the transistor Qub and a cathode K of the free wheeling diode Dub are connected to each other. The emitter E of the transistor Qua and the anode A of the free wheeling diode Dua, and the collector C of the transistor Qub and the cathode K of the free wheeling diode Dub are connected to each other and connected to the power output terminal 81u. An emitter E of the transistor Qub and an anode A of the free wheeling diode Dub are connected to each other and connected to the negative electrode terminal 212 of the power input terminal 21u.

A gate G of the transistor Qua is connected to the connection section 311 (see FIG. 1) of the gate signal output terminal 31ua by the wire 150. The emitter E of the transistor Qua is connected to the connection section 321 (see FIG. 1) of the reference signal output terminal 32ua by the wire 150.

As illustrated in FIG. 3, the semiconductor element Sva has a transistor Qva, which is the IGBT, for example, and a free wheeling diode Dva connected in antiparallel to the transistor Qva. The transistor Qva and the free wheeling diode Dva are formed on one semiconductor substrate and made into one chip, for example. The semiconductor element Svb has a transistor Qvb, which is the IGBT, for example, and a free wheeling diode Dvb connected in antiparallel to the transistor Qvb. The transistor Qvb and the free wheeling diode Dvb are formed on one semiconductor substrate and made into one chip, for example.

A collector C of the transistor Qva and a cathode K of the free wheeling diode Dva are connected to each other and connected to the positive electrode terminal 211 of the power input terminal 21v. An emitter E of the transistor Qva and an anode A of the free wheeling diode Dva are connected to each other. A collector C of the transistor Qvb and a cathode K of the freewheeling diode Dvb are connected to each other. The emitter E of the transistor Qva and the anode A of the freewheeling diode Dva, and the collector C of the transistor Qvb and the cathode K of the free wheeling diode Dvb are connected to each other and connected to the power output terminal 81v. An emitter E of the transistor Qvb and an anode A of the free wheeling diode Dvb are connected to each other and connected to the negative electrode terminal 212 of the power input terminal 21v.

A gate G of the transistor Qva is connected to the connection section 311 (see FIG. 1) of the gate signal output terminal 31va by the wire 150. The emitter E of the transistor Qva is connected to the connection section 321 (see FIG. 1) of the reference signal output terminal 32va by the wire 150.

As illustrated in FIG. 3, the semiconductor element Swa has a transistor Qwa, which is the IGBT, for example, and a free wheeling diode Dwa connected in antiparallel to the transistor Qwa. The transistor Qwa and the free wheeling diode Dwa are formed on one semiconductor substrate and made into one chip, for example. The semiconductor element Swb has a transistor Qwb, which is the IGBT, for example, and a free wheeling diode Dwb connected in antiparallel to the transistor Qwb. The transistor Qwb and the free wheeling diode Dwb are formed on one semiconductor substrate and made into one chip, for example.

A collector C of the transistor Qwa and a cathode K of the free wheeling diode Dwa are connected to each other and connected to the positive electrode terminal 211 of the power input terminal 21w. An emitter E of the transistor Qwa and an anode A of the free wheeling diode Dwa are connected to each other. A collector C of the transistor Qwb and a cathode K of the free wheeling diode Dwb are connected to each other. The emitter E of the transistor Qwa and the anode A of the free wheeling diode Dwa, and the collector C of the transistor Qwb and the cathode K of the free wheeling diode Dwb are connected to each other and connected to the power output terminal 81w. An emitter E of the transistor Qwb and an anode A of the free wheeling diode Dwb are connected to each other and connected to the negative electrode terminal 212 of the power input terminal 21w.

A gate G of the transistor Qwa is connected to the connection section 311 (see FIG. 1) of the gate signal output terminal 31*wa* by the wire 150. The emitter E of the transistor Qwa is connected to the connection section 321 (see FIG. 1) of the reference signal output terminal 32*wa* by the wire 150.

The gate pulse signal output from the control circuit (not illustrated) is input into the gate G of the transistor Qua provided in the semiconductor element Sua and a DC reference signal output from the control circuit is input into the emitter E of the transistor Qua provided in the semiconductor element Sua. Therefore, a potential difference between the potential of the gate pulse signal and the potential of the reference signal is applied as a gate-emitter voltage to the transistor Qua.

To the transistor Qub provided in the semiconductor element Sub, the potential difference between the potential of the gate pulse signal output from the control circuit and the potential of the reference signal is applied as the gate-emitter voltage. To the transistor Qva provided in the semiconductor element Sva, the potential difference between the potential of the gate pulse signal output from the control circuit and the potential of the reference signal is applied as the gate-emitter voltage. To the transistor Qvb provided in the semiconductor element Svb, the potential difference between the potential of the gate pulse signal output from the control circuit and the potential of the reference signal is applied as the gate-emitter voltage. To the transistor Qwa provided in the semiconductor element Swa, the potential difference between the potential of the gate pulse signal output from the control circuit and the potential of the reference signal is applied as the gate-emitter voltage. To the transistor Qwb provided in the semiconductor element Swb, the potential difference between the potential of the gate pulse signal output from the control circuit and the potential of the reference signal is applied as the gate-emitter voltage.

The transistors Qua, Qub, Qva, Qvb, Qwa, Qwb are turned on when the voltage level of the gate pulse signal is high and turned off when the voltage level of the gate pulse signal is low, for example. Although a detailed description is omitted, the transistors Qua, Qub provided in the inverter circuit 15*u*, the transistors Qva, Qvb provided in the inverter circuit 15*v*, and the transistors Qwa, Qwb provided in the inverter circuit 15*w* are repeatedly turned on and turned off at predetermined timings and in predetermined combinations. Thus, the semiconductor module 1 can supply, to the motor M, the U-phase AC power, the V-phase AC power, and the W-phase AC power, whose phases are shifted from one another by a predetermined amount, from the power output terminals 81*u*, 81*v*, 81*w* of the inverter circuits 15*u*, 15*v*, 15*w*, respectively.

(Configuration of Partition Section)

Figure 4:
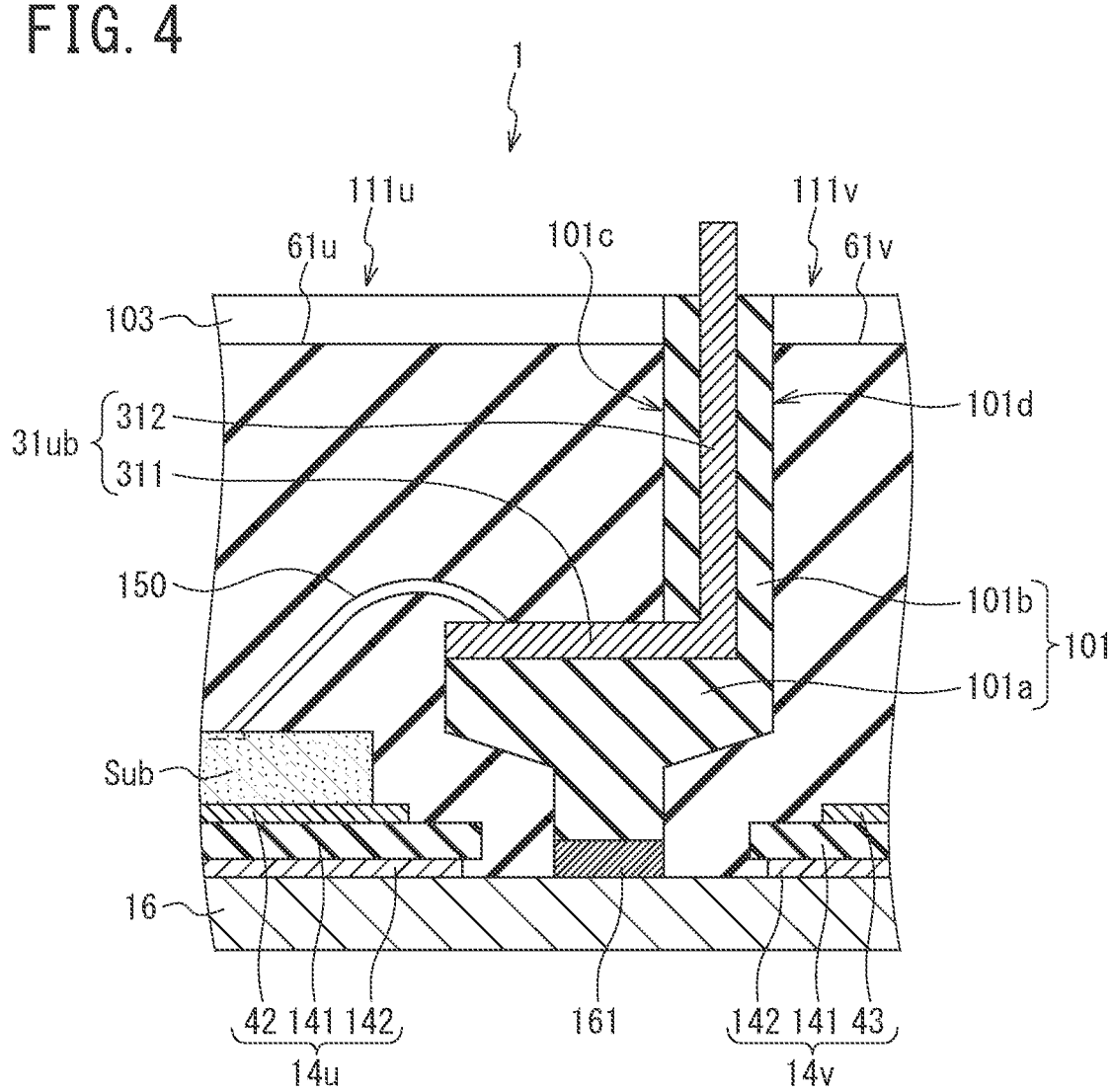
FIG. 4 is a diagram for explaining a partition section provided in the semiconductor module according to one embodiment of the present invention and is a cross-sectional view illustrating the vicinity of the partition section illustrated in FIG. 2 in an enlarged manner.
Figure 5:
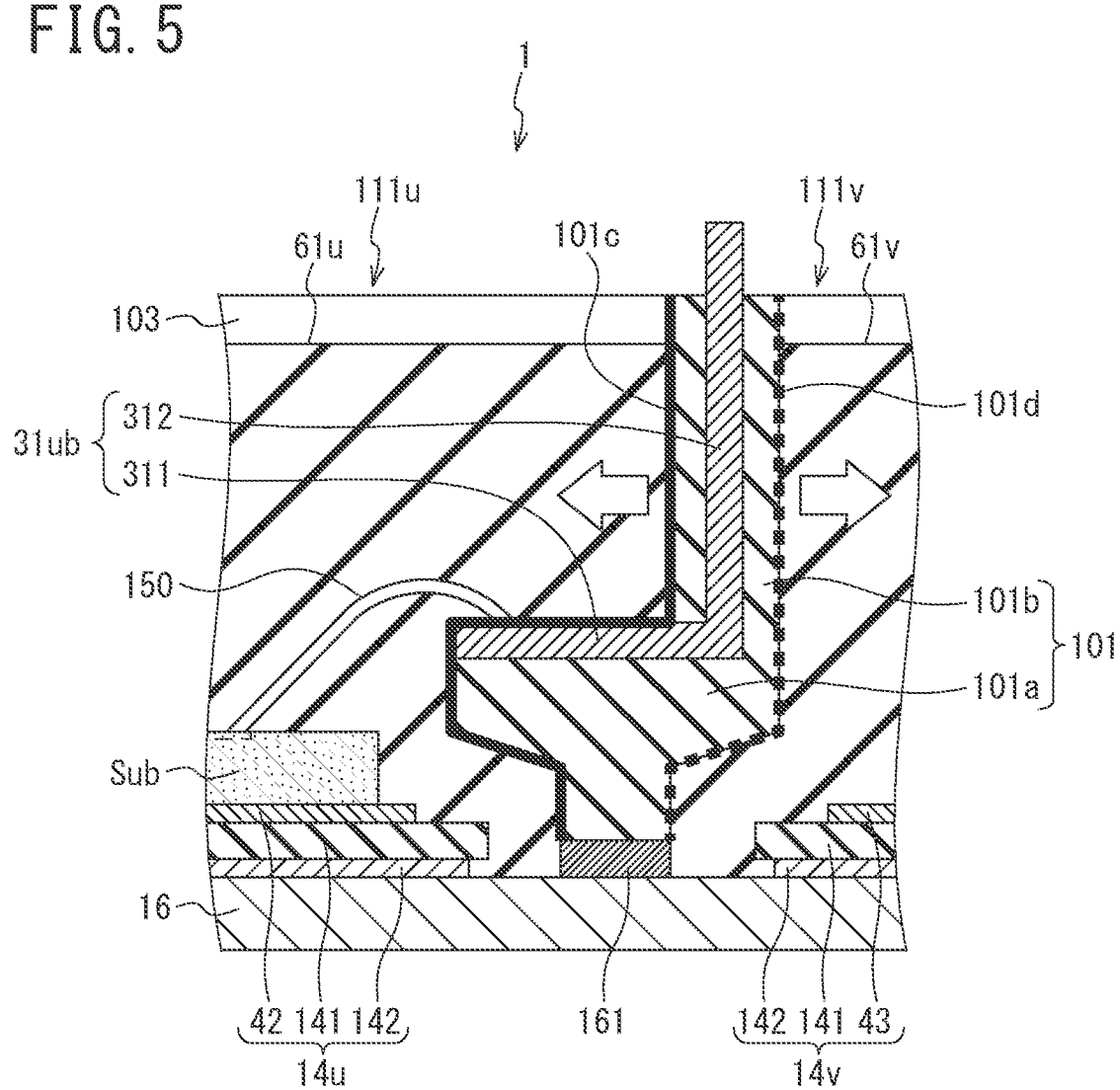
FIG. 5 is a diagram for explaining a first surface section and a second surface section of the partition section provided in the semiconductor module according to one embodiment of the present invention and is a cross-sectional view illustrating the vicinity of the partition section illustrated in FIG. 2 in an enlarged manner.

Next, the configurations of the partition sections 101, 102 provided in the semiconductor module 1 according to this embodiment are described using FIG. 4 and FIG. 5 referring to FIG. 1 to FIG. 3. The partition section 101 and the partition section 102 have the same configuration. Therefore, the configurations of the partition sections 101, 102 are described taking the partition section 101 as an example. FIG. 4 and FIG. 5 illustrate the vicinity of the partition section 101 illustrated in FIG. 2 in an enlarged manner.

As illustrated in FIG. 4, the partition section 101 has a base section 101*a* fixed to the cooler 16 and a wall section 101*b* projecting from the base section 101*a*. The base section 101*a* and the wall section 101*b* are integrally formed with each other. The wall section 101*b* is arranged on the base section 101*a* to be closer to the housing section 111*v* side. Thus, the partition section 101 has a bent shape. The partition section 101 has an L-shaped cross section orthogonal to the extension direction.

The gate signal output terminal 31*ub* has a shape along the shape of the bent partition section 101. Therefore, the gate signal output terminal 31*ub* also has a bent shape, and has an L-shaped cross section orthogonal to the extension direction of the partition section 101. The gate signal output terminal 31*ub* has the connection section 311 arranged on the base section 101*a* and the input section 312 arranged on the wall section 101*b*. A part of the connection section 311 is exposed from the base section 101*a*. A certain region including a tip section of the input section 312 is exposed from the wall section 101*b*. The input section 312 exposed from the wall section 101*b* and the control circuit are connected to each other.

As described above, the semiconductor element Sub and the gate signal output terminal 31*ub* are connected to each other by wire bonding. The wire 150 used for the wire bonding is connected to the connection section 311 of the gate signal output terminal 31*ub*. Therefore, the connection section 311 is a bonded section between the semiconductor element Sub and the wire 150. Thus, the gate pulse signal generated by the control circuit is input into the gate G of the transistor Qub (see FIG. 3) provided in the semiconductor element Sub via the input section 312 and the connection section 311 of the gate signal output terminal 31*ub* and the wire 150.

The partition section 101 has a first surface section 101*c* on the side where the connection sections 311 are arranged and a second surface section 101*d* formed, on the side where the connection sections 311 are not arranged, such that the peeling strength to the sealing resins 61*u*, 61*v* is lower than that of the first surface section 101*c*. The first surface section 101*c* is also the side where the connection sections 321 are arranged. More specifically, as illustrated by the thick solid line in FIG. 5, the first surface section 101*c* is a region excluding the connection sections 311, 321 of the surfaces of the base section 101*a* and the wall section 101*b* of the partition section 101 directed to the housing section 111*u*. As illustrated by the thick broken line in FIG. 5, the second surface section 101*d* includes the surfaces of the base section 101*a* and the wall section 101*b* of the partition section 101 directed to the housing section 111*v*.

The semiconductor module 1 is configured such that the peeling strength of the first surface section 101*c* is higher than the peeling strength of the second surface section 101*d* by differentiating the surface roughness of the first surface section 101*c* and the surface roughness of the second surface section 101*d* from each other. Specifically, the first surface section 101*c* is formed such that the surface roughness is larger than that of the second surface section 101*d*. More specifically, when the surface roughness of the first surface section 101*c* is defined as SR1 and the surface roughness of the second surface section 101*d* is defined as SR2, the partition section 101 is formed to satisfy the relationship of Equation (1) below.

$$SR1 > SR2 \tag{1}$$

By roughening the surface of the partition section 101, fine irregularities are formed in the surface of the partition section 101. This increases the contact area between the sealing resin 61*u* and the partition section 101, and therefore the peeling strength to the sealing resin 61*u* is increased. Further, the anchor effect due to the irregularities formed in the surface of the partition section 101 increases the peeling strength to the sealing resin 61*u*. Therefore, the peeling strength of the first surface section 101c to the sealing resin 61u is higher than the peeling strength of the second surface section 101d to the sealing resin 61v.

The case 10 is molded by insert molding including injecting a heated and melted thermoplastic resin into an injection molding mold into which the power input terminals 21u, 21v, 21w, the power output terminals 81u, 81v, 81w, the gate signal output terminals 31ua, 31ub, 31va, 31vb, 31wa, 31wb, and the reference signal output terminals 32ua, 32ub, 32va, 32vb, 32wa, 32wb are inserted, and integrating the inserted gate signal output terminals 31ua and the like with the resin.

Therefore, among the surfaces of the injection molding mold, the surfaces for forming the first surface section 101c of the partition section 101 and the first surface section 102c of the partition section 102 (see FIG. 1) are roughened by sandblasting or the like, for example, to form rough surfaces. On the other hand, among the surfaces of the injection molding mold, the surfaces for forming the second surface section 101d of the partition section 101 and the second surface section 102d of the partition section 102 (see FIG. 1) are not roughened and made into surfaces smoother than the surfaces for forming the first surface sections 101c, 102c. This enables the formation of the partition sections 101, 102 satisfying the relationship of Equation (1).

Although details are described later, when a temperature load is applied to the semiconductor module 1, so that the sealing resin of the semiconductor module 1 is deformed, tensile stresses in the opposite directions are generated in the first surface section 101c and the second surface section 101d of the partition section 101 as illustrated by the thick arrows in FIG. 5. More specifically, tensile stresses in the opposite directions are applied to both the surfaces of the partition section 101. The second surface section 101d has the peeling strength to the sealing resins 61u, 61v lower than that of the first surface section 101c. Therefore, when the tensile stresses are generated in the first surface section 101c and the second surface section 101d, the second surface section 101d where the tensile stress stronger than the peeling strength is generated is peeled from the sealing resin 61u. This reduces the tensile stress applied to the first surface section 101c. As a result, the break in the wire 150 in the connection section 311 of the gate signal output terminal 31ub arranged in the partition section 101 can be prevented.

As described above, the semiconductor element Sua, and the gate signal output terminal 31ua and the reference signal output terminal 32ua are connected by wire bonding. The semiconductor element Sub, and the gate signal output terminal 31ub and the reference signal output terminal 32ub are connected by wire bonding. Therefore, the connection section 311 of the gate signal output terminal 31ua and the connection section 321 of the reference signal output terminal 32ua are bonded sections between the semiconductor element Sua and the wires 150. Similarly, the connection section 311 of the gate signal output terminal 31ub and the connection section 321 of the reference signal output terminal 32ub are the bonded sections between the semiconductor element Sub and the wire 150.

The gate signal output terminal 31ua and the reference signal output terminals 32ua, 32ub arranged in the partition section 101 also have the same configuration as that of the gate signal output terminal 31ub. Therefore, even when the semiconductor module 1 is deformed based on the temperature load, the break in the wires 150 in the connection section 311 of the gate signal output terminal 31ua and the connection sections 321 of the reference signal output terminals 32ua, 32ub arranged in the partition section 101 (FIG. 1) can be prevented.

The partition section 102 has the same structure as that of the partition section 101. More specifically, as illustrated in FIG. 1 and FIG. 2, the partition section 102 has a base section 102a having the same shape as that of the base section 101a of the partition section 101 and a wall section 102b having the same shape as that of the wall section 101b of the partition section 101. Therefore, in the partition section 102, the gate signal output terminals 31va, 31vb and the reference signal output terminals 32va, 32vb are arranged in a state of being bent along the bent shape of the partition section 102 as with the gate signal output terminal 31ua and the like arranged in the partition section 101.

The partition section 102 has a first surface section 102c on the side where the connection sections 311 are arranged and a second surface section 102d formed, on the side where the connection sections 311 are not arranged, such that the peeling strength to the sealing resins 61v, 61w is lower than that of the first surface section 102c. The first surface section 102c is also the side where the connection sections 321 of the reference signal output terminals 32va, 32vb are arranged. The first surface section 102c is a region excluding the connection sections 321 of the surfaces of the base section 102a and the wall section 102b of the partition section 102 directed to the housing section 111v. The second surface section 102d includes the surfaces of the base section 102a and wall section 102b of the partition section 102 directed to the housing section 111w. The partition section 102 is configured such that the peeling strength of the first surface section 102c is higher than the peeling strength of the second surface section 102d by differentiating the surface roughness of the first surface section 102c and the surface roughness of the second surface section 102d from each other as with the partition section 101. Specifically, the first surface section 102c is formed such that the surface roughness is larger than that of the second surface section 102d.

Similarly to the case where the first surface section 101c of the partition section 101 is roughened, among the surfaces of the injection molding mold for forming the case 10, the surface for forming the first surface section 102c of the partition section 102 is roughened by sandblasting or the like, for example. On the other hand, among the surfaces of the injection molding mold, the surface for forming the second surface section 102d of the partition section 102 (see FIG. 1) is not roughened and made into a surface smoother than the surface for forming the first surface section 102c. Thus, when the surface roughness of the first surface section 102c is defined as SR1 and the surface roughness of the second surface section 102d is defined as SR2, the partition section 102 is formed to satisfy the relationship of Equation (1) above.

As described above, the partition section 102 has the same structure as that of the partition section 101, and therefore, even when the semiconductor module 1 is deformed based on the temperature load, the break in the wires 150 in the connection sections 311 of the gate signal output terminals 31va, 31vb and the connection sections 321 of the reference signal output terminals 32va, 32wb arranged in the partition section 102 can be prevented.

As illustrated in FIG. 1 and FIG. 2, the shape of the terminal arrangement region 103a of the outer frame 103 where the gate signal output terminals 31wa, 31wb and the reference signal output terminals 32wa, 32wb connected to the laminated substrate 14w are arranged has a bent shape as with the partition sections 101, 102. Therefore, the gate signal output terminals 31wa, 31wb and the reference signal output terminals 32wa, 32wb are arranged in the outer frame 103 in a bent state along the bent shape of the terminal arrangement region 103a of the outer frame 103.

In the terminal arrangement region 103a of the outer frame 103, the side where the connection sections 311, 321 are not arranged is the outside, on which the sealing resin is not formed. Therefore, even when the semiconductor module 1 is deformed based on the temperature load, a tensile stress from the outside is not generated in the terminal arrangement region 103a, unlike the partition sections 101, 102. Thus, when the semiconductor module 1 is deformed, a tensile stress from the sealing resin 61w formed in the housing section 111w is less likely to be transmitted to the wires 150 bonded to the connection sections 311, 321 arranged in the terminal arrangement region 103a. Therefore, in this embodiment, the surface of the terminal arrangement region 103a on the side where the connection sections 311, 321 are arranged may be roughened, but may not be roughened unlike the first surface sections 101c, 102c.

(Actions/Effects of Partition Section)

Figure 6:
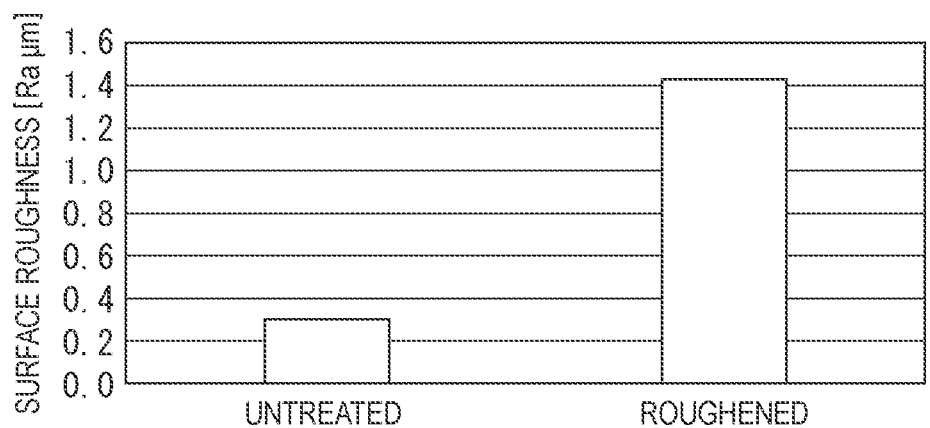
FIG. 6 is a graph for explaining the surface roughness of the first surface section and the second surface section of the partition sections provided in the semiconductor module according to one embodiment of the present invention.
Figure 7:
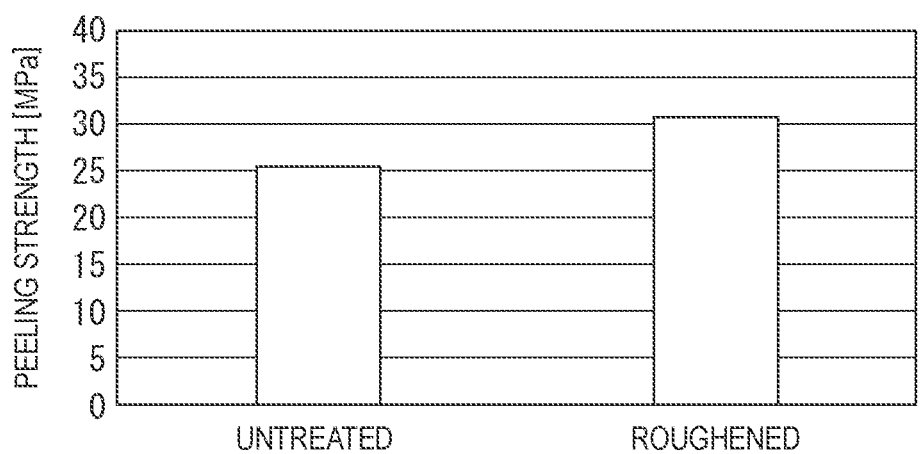
FIG. 7 is a graph for explaining the peeling strength of the first surface section and the second surface section of the partition sections provided in the semiconductor module according to one embodiment of the present invention.

Next, the actions and the effects of the partition sections 101, 102 provided in the semiconductor module 1 are described using FIG. 6 and FIG. 7 referring to FIG. 1 to FIG. 5.

In the semiconductor module 1 according to this embodiment, the case 10 and the cooler 16 are fixed to each other in the state where the laminated substrates 14u, 14v, 14w soldered to the cooler 16 are housed in the housing sections 111u, 111v, 111w, respectively, as described above. Further, the sealing resins 61u, 61v, 61w are formed in the housing sections 111u, 111v, 111w to cover the laminated substrates 14u, 14v, 14w, respectively, and the like (see FIG. 2). The cooler 16 is made of aluminum, for example, and the insulating substrate 141 provided on each of the laminated substrates 14u, 14v, 14w is made of ceramic, for example. Therefore, the linear expansion coefficient of the cooler 16 is about 7 to 8 times larger than the linear expansion coefficient of the insulating substrate 141.

In the semiconductor module 1, a thermal shock test is carried out as part of a reliability test. In the thermal shock test, due to the temperature load applied to the semiconductor module 1 and the difference in the linear expansion coefficient of the cooler 16 and the insulating substrate 141, the semiconductor module 1 is deformed to bend in the forward warping direction in the longitudinal direction of the case 10. Therefore, a stress is applied between the partition section 101 and the sealing resins 61u, 61v, and a stress is applied between the partition section 102 and the sealing resins 61v, 61w. As a result, as illustrated by the thick straight arrows in FIG. 2, symmetrical tensile stresses are applied to the partition section 101 and symmetrical tensile stresses are also applied to the partition section 102. Thus, the sealing resin 61u is subjected to a force in a direction of being peeled from the partition section 101, the sealing resin 61v is subjected to a force in a direction of being peeled from the partition sections 101, 102, and the sealing resin 61w is subjected to a force in a direction of being peeled from the partition section 102. Further, the semiconductor module 1 is deformed also by the shrinkage of the sealing resins 61u, 61v, 61w after the formation thereof, and the tensile stresses from the sealing resins 61u, 61v, 61w are applied to the partition sections 101, 102 in some cases, without being limited to the thermal shock test.

The simulation analysis of section disassembly analysis results of partition sections and a tensile stress applied to the partition sections of a conventional semiconductor module was performed. The analyzed conventional semiconductor module has a structure similar to that of the semiconductor module 1 according to this embodiment, except that the roughness of a first surface section and the roughness of a second surface section of the partition section are the same.

It was confirmed by the simulation analysis of the tensile stress that the first surface section and the second surface section of the partition section were subjected tensile stresses in the opposite directions with almost the same magnitude. In the section disassembly analysis, the peeling between the partition section and the sealing resin was confirmed in either the first surface section or the second surface section of the partition section. However, the peeling of the sealing resin from the first surface section and the peeling of the sealing resin from the second surface section did not occur at the same time.

Connection sections of control terminals exposed to the first surface section and wires bonded to the connection sections are covered with a sealing resin. In other words, the connection sections and the wires bonded to the connection sections are embedded in the sealing resin and fixed to the sealing resin. Therefore, when the conventional semiconductor module provided with the partition section is deformed in the forward warping direction and the sealing resin is peeled from the first surface section of the partition section, the wires embedded in the sealing resin are subjected to a force in a direction away from the partition section. As a result, the wires are subjected to a force in a direction away from the connection sections of the control terminals arranged in the partition section, so that the wires are broken in the connection sections, causing open defects in the conventional semiconductor module in some cases. When the wires are broken, a gate pulse signal and a reference signal are not input into an inverter circuit from a control circuit, and therefore the conventional semiconductor module does not perform predetermined operations and cannot supply power to a motor, for example, to be driven.

In contrast thereto, in the semiconductor module 1 according to this embodiment, in view of the result that the peeling of the sealing resin does not occur at the same time on both the surfaces of the partition section in the section disassembly analysis, the partition section 101 is formed such that the peeling strength of the first surface section 101c to the sealing resin 61u is higher than the peeling strength of the second surface section 101d to the sealing resin 61v. When tensile stresses in the opposite directions with almost the same magnitude are applied to the first surface section 101c side and the second surface section 101d side of the partition section 101, the sealing resin 61v is peeled from the second surface section 101d before the sealing resin 61u is peeled from the first surface section 101c. This releases one of the tensile stresses applied to the partition section 101 caused by the deformation of the semiconductor module 1 into the forward warped state. As a result, the tensile stress applied to the first surface section 101c from the sealing resin 61u is reduced to the extent that the wire 150 is not broken. This prevents the break in the wires 150 in the connection sections 311. Although a detailed description is omitted, the partition section 102 is also formed such that the peeling strength of the first surface section 102c to the sealing resin 61v is higher than the peeling strength of the second surface section 102d to the sealing resin 61w. Therefore, the partition section 102 similarly acts on the sealing resins 61v, 61w in the same manner as the action of the partition section 101 on the sealing resins 61u, 61v, and thus the break in the wires 150 in the connection sections 311, 321 provided in the partition section 102 is prevented.

Even when the sealing resins 61v, 61w are peeled in the second surface sections 101d, 102d, respectively, the inverter circuits 15v, 15w and the laminated substrates 14v, 14w are covered with the sealing resins 61v, 61w, respectively. Therefore, the semiconductor module 1 obtains the effect of an improvement of the insulation properties and the reliability even after the sealing resins 61v, 61w are peeled from the second surface sections 101d, 102d, respectively.

FIG. 6 is a graph showing the surface roughness of the first surface sections 101c, 102c and the second surface sections 101d, 102d of the partition sections 101, 102, respectively. The "Untreated" of the horizontal axis of the graph illustrated in FIG. 6 indicates that the surfaces are not roughened and the surfaces correspond to the second surface sections 101d, 102d. The "Roughened" of the horizontal axis of the graph illustrated in FIG. 6 indicates that the surfaces are roughened and the surfaces correspond to the first surface sections 101c, 102c. The vertical axis of the graph illustrated in FIG. 6 indicates the surface roughness [Ra μm]. The surface roughness [Ra μm] is the arithmetic average roughness based on the provisions of "JIS B 0601 (1994)/JIS B 0031 (1994)".

FIG. 7 is a graph showing the peeling strength of the partition sections 101, 102 to the sealing resins 61u, 61v, 61w when the surface roughness of the partition sections 101, 102 is set to the magnitude illustrated in FIG. 6. The "Untreated" illustrated in FIG. 7 has the same contents as those of the "Untreated" illustrated in FIG. 6. The "Roughened" illustrated in FIG. 7 has the same contents as those of the "Roughened" illustrated in FIG. 6. Therefore, the description is omitted. The vertical axis of the graph illustrated in FIG. 7 indicates the peeling strength [MPa].

As illustrated in NPL 1, the results of the peeling strength of a pudding cup test relate to both a normal stress and a shear stress to the surface of a plate and are useful as an index for evaluating the bonding strength of the interface between the sealing resin and the plate. The peeling strength in this embodiment was measured by the pudding cup test. The pudding cup test is a test including directly molding a pudding-shaped resin on a plate, laterally (one in-plane direction of the surface of the plate to which the resin is bonded) pressing the resin with a constant force, and measuring a force (adhesion force) until the resin is peeled from the plate. The pudding cup test can measure the peeling strength of the partition section to the sealing resin. The greater the measured force, the higher the peeling strength (i.e., adhesiveness).

Figure 8:
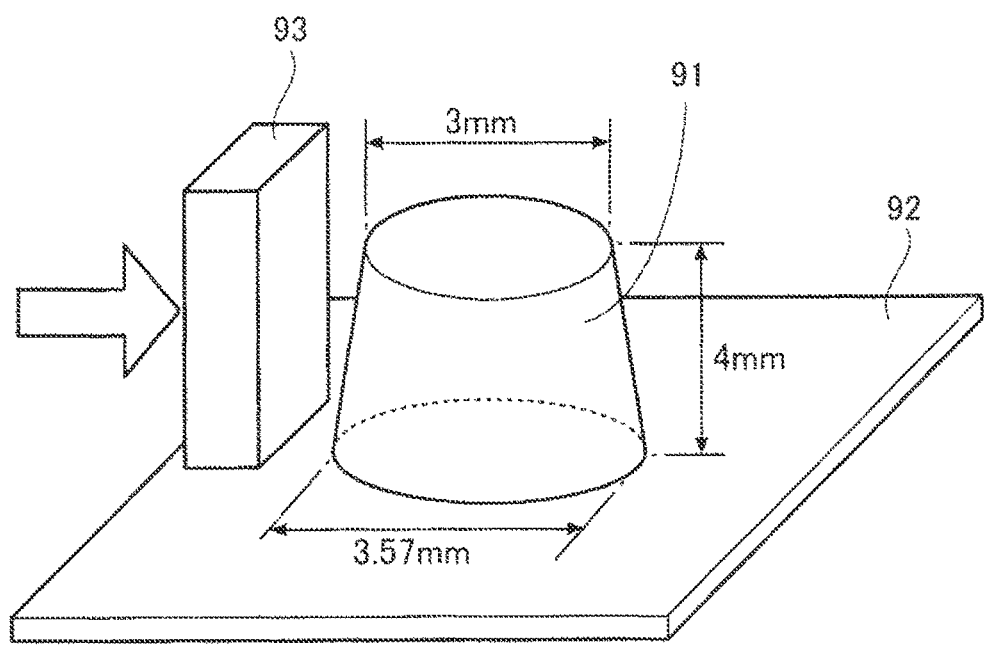
FIG. 8 is a diagram for explaining the peeling strength of the first surface section and the second surface section of the partition sections provided in the semiconductor module according to one embodiment of the present invention and is a diagram for explaining a pudding cut test for measuring the peeling strength illustrated in FIG. 7.

As illustrated in FIG. 8, in this embodiment, the test was performed using a resin plate 92 made of the same material as that of the partition sections 101, 102 and having a predetermined size (for example, 11 [mm] in length, 11 [mm] in width, and 1.87 [mm] in thickness) and a resin 91 made of the same material as that of the sealing resins 61u, 61v, 61w and having a predetermined size (The diameter of the bottom surface in contact with the resin plate 92 is 3.75 [mm], the diameter of the upper surface is 3 [mm], and the height is 4 [mm].), and the test was performed by pressing a plunger 93 against the resin 91 to apply a force to the resin 91 in the direction indicated by the thick arrow in FIG. 8. At that time, two resin plates 92 are prepared. One surface of each of the two resin plates 92 was formed to have the surface roughness illustrated in "Untreated" in FIG. 7, and the other surface of each of the two resin plates 92 was formed to have the surface roughness illustrated in "Roughened" in FIG. 7.

As illustrated in FIG. 6, the surface roughness of the second surface sections 101d, 102d is, for example, 0.3, and the surface roughness of the first surface sections 101c, 102c is, for example, 1.43. Therefore, the first surface sections 101c, 102c may have surface roughness 5 times or more that of the second surface sections 101d, 102d.

As illustrated in FIG. 7, when the surface roughness of the second surface sections 101d, 102d is, for example, 0.3, the peeling strength of the second surface sections 101d, 102d to the sealing resins 61v, 61w is, for example, 26 [MPa]. On the other hand, when the surface roughness of the first surface sections 101c, 102c is, for example, 1.43, the peeling strength of the first surface sections 101c, 102c to the sealing resins 61u, 61v is, for example, 31 [MPa]. Thus, by increasing the surface roughness of the partition sections 101, 102, the peeling strength to the sealing resin 61u, 61v, 61w can be increased.

As described above, the semiconductor module 1 according to this embodiment includes: the outer frame 103 defining the space 11 where the plurality of semiconductor elements Sua, Sub, Sva, Svb, Swa, Swb is arranged; the sealing resins 61u, 61v, 61w formed in the space 11 to cover the plurality of semiconductor elements Sua to Swb; the gate signal output terminals 31ua, 31ub, 31va, 31vb, 31wa, 31wb which are connected to the semiconductor elements Sua to Swb and from which the gate pulse signals controlling the semiconductor elements Sua to Swb are output and the reference signal output terminals 32ua, 32ub, 32va, 32vb, 32wa, 32wb which are connected to the semiconductor elements Sua to Swb and from which the reference signals are output; and the partition sections 101, 102 laid across the outer frame 103 to partition the space 11 into the plurality of housing sections 111u, 111v, 111w, in the partition sections 101, 102 which the gate signal output terminals 31ua to 31wb and the reference signal output terminals 32ua to 32wb with the connection sections 311, 321, respectively, to the semiconductor elements Sua to Swb exposed are arranged. The partition sections 101, 102 have the first surface sections 101c, 102c, respectively, on the side where the connection sections 311, 321 are arranged and the second surface sections 101d, 102d, respectively, formed, on the side where the connection sections 311, 321 are not arranged, such that the peeling strength to the sealing resins 61u, 61v, 61w is lower than that of the first surface sections 101c, 102c.

In the semiconductor module 1, the second surface sections 101d, 102d having relatively low peeling strength are intentionally provided as regions for releasing the tensile stresses generated in the partition sections 101, 102. The semiconductor module 1 can prevent the peeling of the sealing resins 61u, 61v on the side where the connection sections 311, 321 used for the connection to the semiconductor elements Sua to Swb are arranged (i.e., the first surface sections 101c, 102c of the partition sections 101, 102, respectively).

(Modification)

A semiconductor module according to a modification of this embodiment is described using FIG. 2 and FIG. 5.

In the semiconductor module 1 according to this modification, the partition section 101 has a release agent formed on the second surface section 101d. More specifically, in the partition section 101, the release agent may be formed in a region illustrated by the thick broken line in FIG. 5. On the other hand, the release agent is not formed on the first surface section 101c of the partition section 101, and the first surface section 101c is not roughened. Thus, when the semiconductor module 1 is deformed in the forward warping direction, so that a tensile stress is generated in the partition section 101 as illustrated by the thick arrows in FIG. 2, the sealing resin 61v is likely to be peeled from the second surface section 101d. By the peeling of the sealing resin 61v from the second surface section 101d, the tensile stress applied to the first surface section 101c from the sealing resin 61u is reduced to the extent that the wire 150 is not cut. As a result, the semiconductor module 1 can prevent the cutting of the wires 150 connected to the connection sections 311, 321 exposed to the partition section 101.

Further, in the semiconductor module 1 according to this modification, the partition section 102 has a release agent formed on the second surface section 102d. This makes it possible for the semiconductor module 1 to prevent the cutting of the wires 150 connected to the connection sections 311, 321 exposed to the partition section 102.

As described above, the semiconductor module 1 according to this modification can prevent the peeling of the sealing resins 61u, 61v on the side where the connection sections 311, 321 used for the connection to the semiconductor elements Sua to Swb are arranged (i.e., the first surface sections 101c, 102c of the partition sections 101, 102, respectively).

The present invention can be variously modified without being limited to the above-described embodiment.

It may be acceptable that, in the partition sections 101, 102 provided in the semiconductor module 1, the first surface sections 101c, 102c are formed such that the surface roughness is larger than that of the second surface sections 101d, 102d and have the release agents formed on the second surface sections 101d, 102d, respectively. Thus, the semiconductor module 1 obtains the same effects as those of the semiconductor module 1 according to the above-described embodiment.

In the above-described embodiment, the transistors provided in the semiconductor elements contain the IGBT but may be configured by wide bandgap semiconductor elements.

The technical scope of the present invention is not limited to the illustrated and described exemplary embodiments and also includes all embodiments producing effects equivalent to the effects targeted by the present invention. Further, the technical scope of the present invention is not limited to combinations of features of the invention defined by each claim and can be defined by any desired combination of specific features of all the disclosed features.

REFERENCE SIGNS LIST 1 semiconductor module
10 case
11 space
14u, 14v, 14w laminated substrate
15u, 15v, 15w inverter circuit
16 cooler
21u, 21v, 21w power input terminal
31ua, 31ub, 31va, 31vb, 31wa, 31wb gate signal output terminal
32ua, 32ub, 32va, 32vb, 32wa, 32wb reference signal output terminal
41 positive electrode section pattern
42 negative electrode section pattern
43 output section pattern
61u, 61v, 61w sealing resin
81u, 81v, 81w power output terminal
101, 102 partition section
101a, 102a base section
101b, 102b wall section
101c, 102c first surface section
101d, 102d second surface section
103 outer frame
103a terminal arrangement region
111u, 111v, 111w housing section
141 insulating substrate
142 heat transfer member
150 wire
211 positive electrode terminal
212 negative electrode terminal
311, 321 connection section
312, 322 input section
Sua, Sub, Sva, Svb, Swa, Swb semiconductor element

The invention claimed is:

1. A semiconductor module comprising:
an outer frame defining a space where a plurality of semiconductor elements is arranged;
sealing resins formed in the space to cover the plurality of semiconductor elements;
control terminals connected to the semiconductor elements and configured to output control signals to the semiconductor elements, the control signals controlling the semiconductor elements; and
a partition section laid across the outer frame to partition the space into a plurality of regions, in the partition section which the control terminals with connection sections to the semiconductor elements exposed are arranged, wherein
the partition section has a first surface section on a side where the connection sections are arranged and a second surface section formed, on a side where the connection sections are not arranged, such that peeling strength to the sealing resin is lower than peeling strength to the sealing resin of the first surface section.

2. The semiconductor module according to claim 1, wherein the first surface section is formed such that surface roughness of the first surface is larger than surface roughness of the second surface section.

3. The semiconductor module according to claim 2, wherein the first surface section has the surface roughness 5 times or more the surface roughness of the second surface section.

4. The semiconductor module according to claim 1, wherein the partition section has a release agent formed on the second surface section.

5. The semiconductor module according to claim 1, wherein
the semiconductor element and the control terminal are connected by wire bonding, and
the connection section is a bonded section between the semiconductor element and a wire.

6. The semiconductor module according to claim 2, wherein the partition section has a release agent formed on the second surface section.

7. The semiconductor module according to claim 3, wherein the partition section has a release agent formed on the second surface section.

8. The semiconductor module according to claim 2, wherein
the semiconductor element and the control terminal are connected by wire bonding, and
the connection section is a bonded section between the semiconductor element and a wire.

9. The semiconductor module according to claim 3, wherein
the semiconductor element and the control terminal are connected by wire bonding, and the connection section is a bonded section between the semiconductor element and a wire.

10. The semiconductor module according to claim 4, wherein the semiconductor element and the control terminal are connected by wire bonding, and the connection section is a bonded section between the semiconductor element and a wire.

\* \* \* \* \*